United States Patent [19]
Kuroda et al.

[11] Patent Number: 5,121,182
[45] Date of Patent: Jun. 9, 1992

[54] INTEGRATED OPTICAL SEMICONDUCTOR DEVICE

[75] Inventors: Fumihiko Kuroda; Nobuo Suzuki, both of Tokyo, Japan

[73] Assignee: Kabushiki Kaisha Toshiba, Kawasaki, Japan

[21] Appl. No.: 665,775

[22] Filed: Mar. 7, 1991

[30] Foreign Application Priority Data

Mar. 7, 1990 [JP] Japan .................................. 2-55577
Feb. 28, 1991 [JP] Japan .................................. 3-55447

[51] Int. Cl.⁵ ...................... H01L 27/14; H01L 29/06
[52] U.S. Cl. ........................................ 357/30; 257/55
[58] Field of Search ........................ 357/30, 55, 51

Primary Examiner—Mark Prenty
Attorney, Agent, or Firm—Oblon, Spivak, McClelland, Maier & Neustadt

[57] ABSTRACT

In an integrated optical semiconductor device having an InGaAsP optical waveguide and an InGaAs light absorption layer integrated together therein, the light absorption layer is formed to become gradually thicker in a traveling direction of light in the optical waveguide so that the effective absorption coefficient of the light absorption layer with respect to the optical waveguide can be set to become gradually larger in the traveling direction in the optical waveguide.

20 Claims, 13 Drawing Sheets

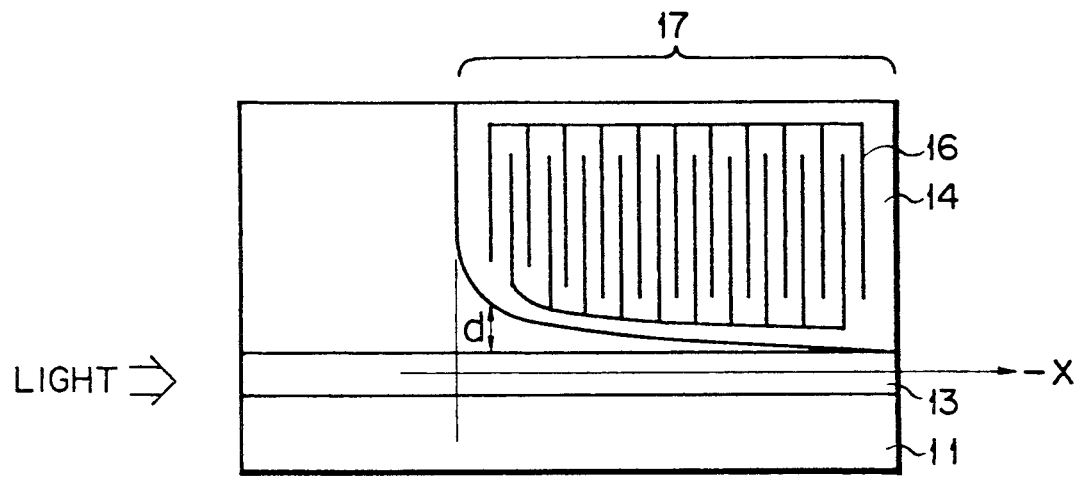
F I G. 9
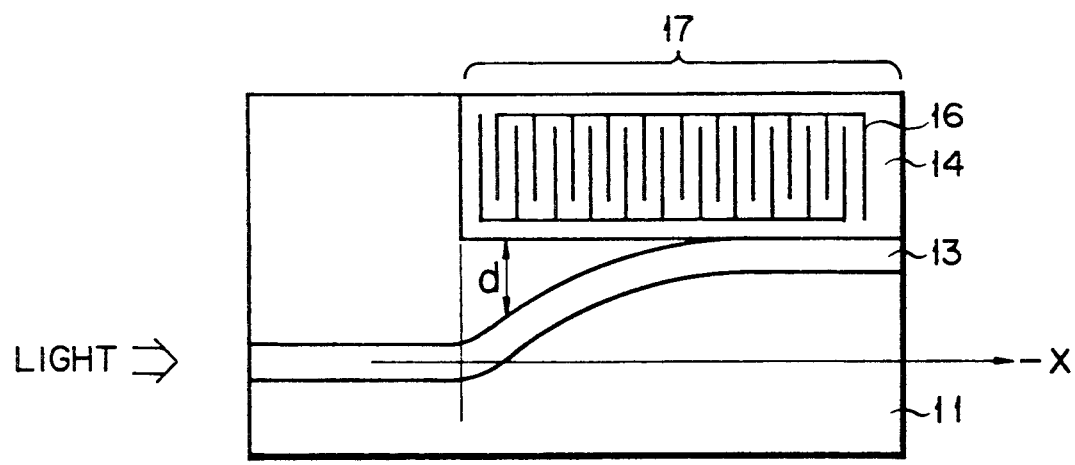
F I G. 10

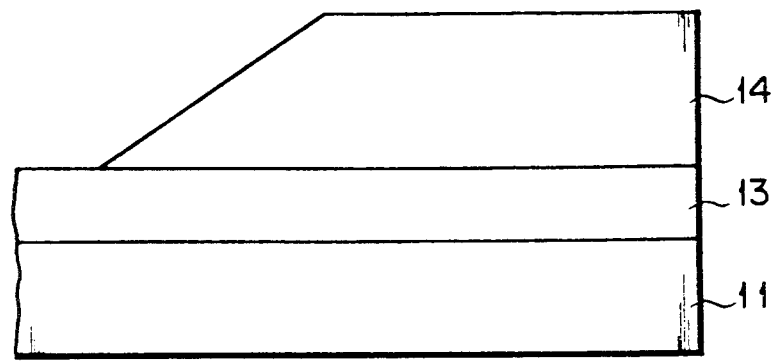
F I G. 15
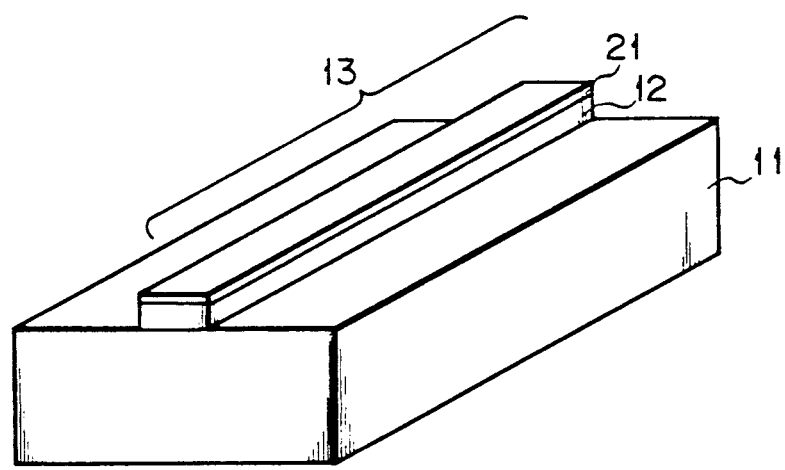
F I G. 16A

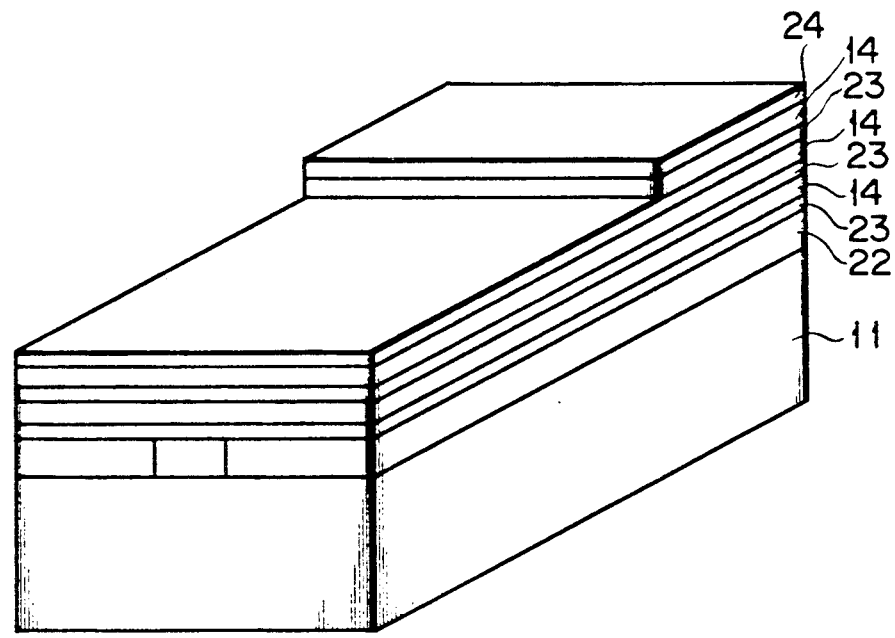
F I G. 16D
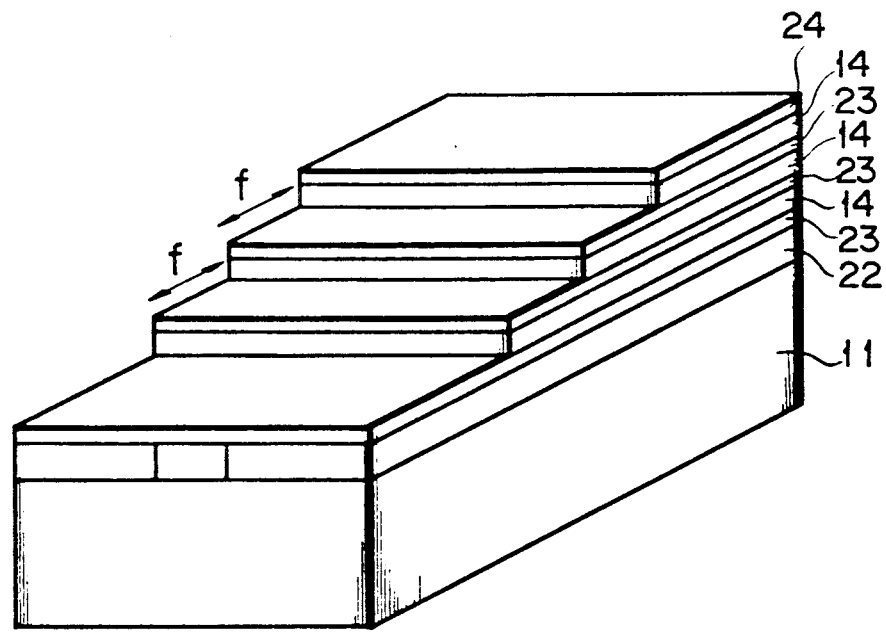
F I G. 16E

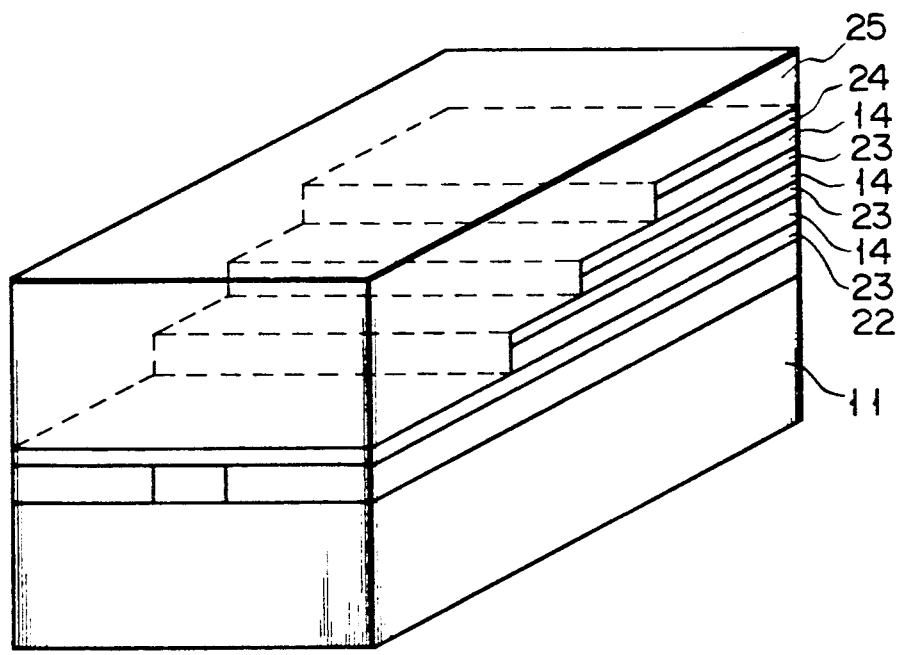
F I G. 16F
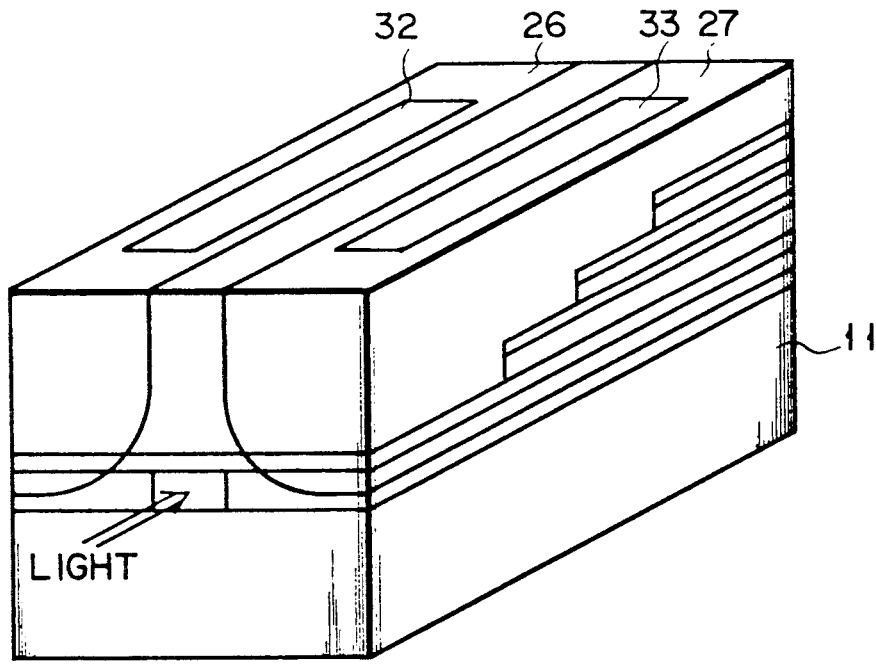
F I G. 16G

INTEGRATED OPTICAL SEMICONDUCTOR DEVICE

BACKGROUND OF THE INVENTION

1. Field of the Invention

This invention relates to an integrated optical semiconductor device having a semiconductor optical waveguide and a light absorption semiconductor layer integrated therein, and more particularly to an integrated optical semiconductor device having an improved interface portion between the optical waveguide and the light absorption layer.

2. Description of the Related Art

In recent years, an optical communication system using a wavelength of 1.55 μm at which the fiber loss becomes minimum has been put into a practical stage, and higher operation speed and larger capacity have been required. However, the present optical communication system is a system which simply utilizes ON and OFF of light and the system has limited operation speed and capacity. For this reason, coherent optical communication systems utilizing the property of light acting as wave are studied from various points of view.

In order to put the optical communication system of high speed and large capacity into practice, it is necessary to integrate electronic devices and optical devices, and an OEIC (opto-electronic-integrated circuit) having electronic elements and optical input/output ports such as light emitting devices/photo detectors integrated therein has been studied for a long period of time. However, in the coherent optical communication system, since the property of light acting as wave is strongly exhibited, it becomes necessary to integrate an optical path such as an optical isolator and an optical waveguide in addition to the above elements, but the study of integration of the optical path and the like is still at the initial stage.

Conventionally, as an example of an integrated optical semiconductor device which has long bee studied, an integrated optical semiconductor device formed by evanescent wave coupling the optical waveguide and the photoelectric element to each other and integrating them is provided. According to the conventional device, an InGaAsp layer 2 having a band gap corresponding to a wavelength of 1.1 μm is buried in an InP substrate to constitute an optical waveguide. An InGaAs light absorption layer, InAlAs Schottky barrier layer and a pair of Schottky electrodes are laminated on a portion of the optical waveguide to constitute a light absorption region.

In the conventional device with the above construction, the refractive indices of InP and InGaAsP are respectively 3.2 and 3.4, and if an interface at which the refractive index is sharply changed is present, light is reflected at the interface. Further, since the refractive index of InGaAsP is larger than that of InP, light travels inside the InGaAsP waveguide. The field strength E of light at this time exhibits such a distribution that the field is high at the center of the optical waveguide but part of the field leaks to the exterior.

If the light absorption layer exists at the foot portion of the electric field distribution, part of the light is absorbed into the light absorbing layer. For this reason, when light is traveling in the light absorption region, the electric field E is gradually decreased. If, in this case, a reverse bias voltage is applied to the optical semiconductor element through a pair of electrodes and the light absorption region is depleted, absorbed light causes electron-hole pairs which are in turn derived out from the electrode as current.

In the above integrated optical semiconductor device, some subjects which must be improved are present. First, when layers of different refractive indices are present on the optical waveguide, the effective refractive index of the optical waveguide is changed. Therefore, light which has traveled in the optical waveguide is subjected to sharp variation in the refractive index at the interface between the optical waveguide and light absorption region and consequently part of the light is reflected at the interface. This causes reduction in the absorption efficiency of the photoelectric element and an increase in noise of the laser due to the returned light.

Further, since a large portion of incident light is absorbed on the incident side of the light absorption region, electron-hole pairs are densely generated on the incident side of the light absorption region. In the case of a coherent optical receiver, local oscillation light of more than several mW is incident, and if the incident light is so intense, deterioration in the response speed due to the space-charge effect and the breakdown of the Schottky barrier due to the concentration of current may be easily caused. Reverse bias of a PN junction is frequently used as means for depleting the light absorption layer, but also in this case, the PN junction may be easily broken down.

If the absorption coefficient of the entire light absorption region is lowered in order to prevent the reflection and space-charge effect, the length of the light absorption region required for absorbing a preset amount of light becomes large, thereby increasing the element area and causing reduction in the response speed due to an increase in the capacity.

Thus, in the conventional integrated optical semiconductor device having the semiconductor optical waveguide and the light absorption semiconductor layer laminated together, the degree of reflection of incident light at the interface between the optical waveguide and the light absorption layer is large, thereby causing reduction in the absorption efficiency and an increase in noise of the laser. Further, electron-hole pairs are densely generated on the light incident side (rear side of the optical waveguide with respect to the light traveling direction) of the light absorption region, thus causing deterioration in the response speed and breakdown of the device.

SUMMARY OF THE INVENTION

An object of this invention is to provide an integrated optical semiconductor device which can suppress the reflection of incident light at the interface between the optical waveguide and the light absorption region and prevent electron-hole pairs from being densely generated on the incident side of the light absorbing region and which is suitable for use in a coherent optical communication system.

According to this invention, the magnitude of an effective absorption coefficient of a light absorption region for absorbing light leaked out from an optical waveguide is changed in a traveling direction of light in the optical waveguide. That is, according to this invention, in an integrated optical semiconductor device having a semiconductor optical waveguide and a light absorption semiconductor layer for absorbing light traveling in the optical waveguide integrated therein, the effective absorption coefficient of the light absorption layer with respect to the optical waveguide is set to gradually vary in the traveling direction of light in the optical waveguide.

The integrated optical semiconductor device for permitting the effective absorption coefficient to increase in the traveling direction of light may be considered to have the following construction:

(1) The light absorption layer is formed to be thin on the light incident side with respect to the traveling direction of the optical waveguide and thick on the light transmitting side. In addition, the light absorption layer is formed by laminating a plurality of layers having different etching properties. Further, the light absorption layer is formed by laminating a plurality of layers having different absorption wavelength ends.

(2) The end face on the light incident side of the light absorption layer with respect to the traveling direction of light in the optical waveguide is set to intersect the optical waveguide at an angle of less than 45°. In this case, the end face of the light absorption layer on the light incident side is formed in a stepped form so as to be set perpendicularly to and in parallel with the optical axis of the optical waveguide and the difference in level in the optical axis direction is set to be $\frac{1}{4}$ of the wavelength of light traveling in the optical waveguide or an odd multiple thereof.

(3) The optical waveguide and the light absorption layer are integrated in a lateral direction and a distance between the end face of the light absorption layer and the optical waveguide is set to gradually decrease.

(4) An electric field applied to the light is set to become gradually intense in the traveling direction of light in the optical waveguide from the light incident side. In this case, a quantum well structure is formed so that the absorption wavelength end of the light absorption layer may be set on the short wavelength side of an intended wavelength of light in the no electric field applying state and on the long wavelength side in the electric field applying state.

(5) The width or thickness of the optical waveguide is gradually reduced in the traveling direction of light.

According to this invention, the effective absorption coefficient (optical coupling efficiency) of the light absorption layer with respect to the optical waveguide is set to gradually vary in the traveling direction of light in the optical waveguide. That is, the effective absorption coefficient of the light absorption region is small on the light incident side of the light absorption region and becomes gradually larger in the light traveling direction. As a result, electron-hole pairs are prevented from being densely generated on the light incident side of the light absorption region so that reduction in the response speed due to the space-charge effect and the breakdown of the device due to concentrated current can be prevented. Further, since the effective refractive index set at this time gradually varies, reflection of the incident light at the interface between the optical waveguide and light absorption region can be suppressed and reduction in the absorption efficiency and an increase in noise of a laser due to returned light can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9 and 10 are plan views of an integrated optical semiconductor device according to another embodiment of this invention and having an optical waveguide and a light absorption layer arranged in parallel with each other;

FIG. 15 is a cross sectional view of an integrated optical semiconductor device absorption to another embodiment of this invention in which a light absorbing layer is formed to be thin on the light incident side and thick on the light transmitting side;

FIGS. 16A to 16G are perspective views of semiconductor structures in the manufacturing process for an integrated optical semiconductor device according to another embodiment of this invention;

DETAILED DESCRIPTION OF THE PREFERRED EMBODIMENTS

There will now be described a method for manufacturing an integrated optical semiconductor device according to an embodiment of this invention with reference to FIGS. 1A to 1C.

Figure 1A:
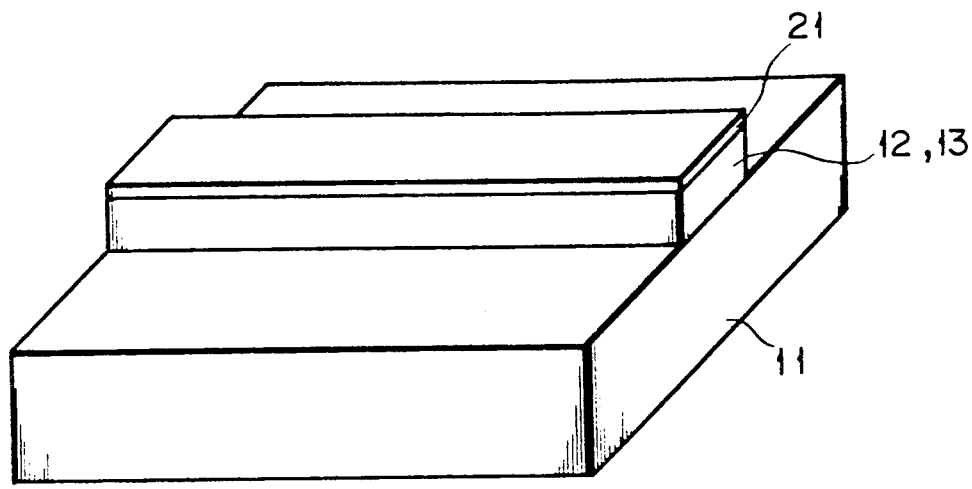
FIGS. 1A to 1C are perspective views of semiconductor structures in the manufacturing process for an integrated optical semiconductor device according to one embodiment of this invention.

As shown in FIG. 1A, an undoped InGaAsP layer 12 having a band gap corresponding to a wavelength of 1.1 $\mu$m composition is formed to a thickness of 0.5 $\mu$m on an InP substrate 11 by epitaxial growth and then etched by ion etching, wet etching or the like with an $SiO_2$ film or the like used as a mask 21 so as to form an optical waveguide 13 having a width of 3 $\mu$m on the substrate 11.

Figure 1B:
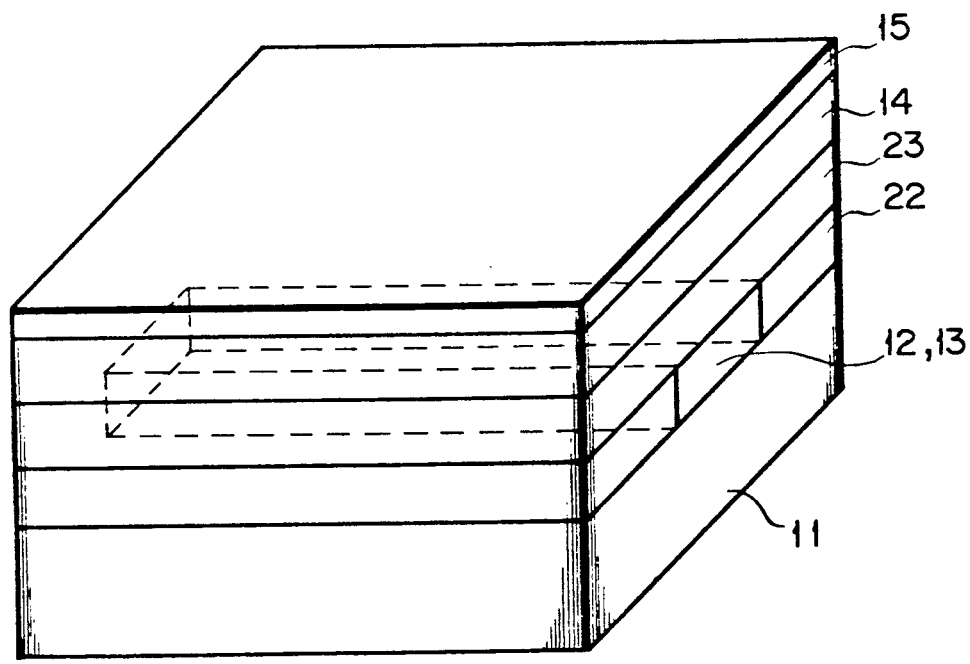

Next, as shown in FIG. 1B, an undoped InP layer 22 is formed by deposition to a thickness of 0.5 $\mu$m on the substrate 11 and thus the optical waveguide 13 is buried in the InP layer 22. After this, the mask 21 is removed, an undoped InP etching stop layer 23 is formed to a thickness of 0.4 $\mu$m, an undoped InGaAs light absorption layer 14 is formed to a thickness of 0.5 $\mu$m and an undoped InAlAs Schottky barrier layer 15 is formed to a thickness of 0.2 $\mu$m in this order by epitaxial growth.

Figure 1C:
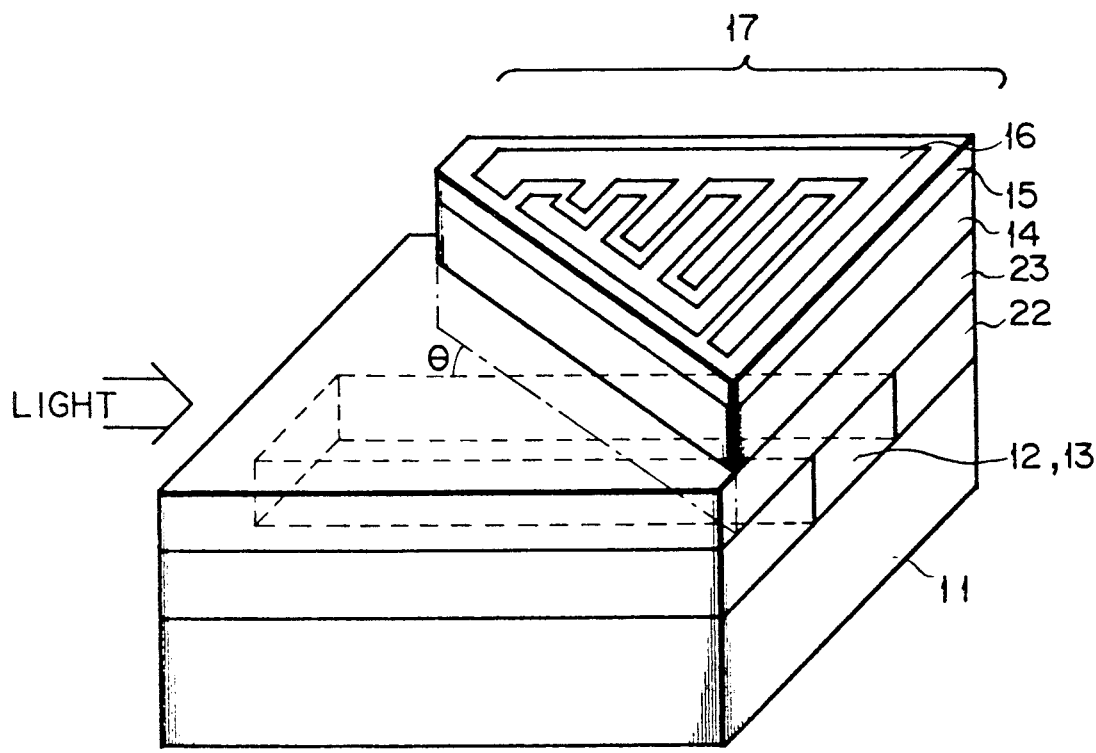

Next, as shown in FIG. 1C, the InGaAs light absorption layer 14 and InAlAs Schottky barrier layer 15 are selectively etched out so that the end faces thereof may intersect the underlying optical waveguide 13 to make a small angle (for example, $\theta = 1°$) with respect to the light propagating direction, that is, the lengthwise direction of the optical waveguide. After this, Schottky electrodes 16 are formed on the InAlAs Schottky barrier layer 15 through the depositing process of gold or the like and the lift-off process, thus completing an integrated optical semiconductor device of this invention.

If portions other than the InGaAs/InAlAs photodiode portion are buried with InP, the integrated optical semiconductor device is formed with a planar structure and becomes more preferable in respect of wiring and reliability. Further, as shown in the drawing, light enters the optical waveguide 13 from the left side thereof, passes through the optical waveguide 13 and is incident on a light absorption region 17.

As described before, if the light absorption layer 14 is formed on the optical waveguide 13, light having traveled along the optical waveguide 13 is absorbed into the light absorption layer 14. At this time, if the end face of the light absorption layer 14 intersects the optical waveguide 13 at a small angle as in this embodiment, the effective absorption coefficient of the light absorption layer 14 with respect to the optical waveguide 13, that is, the efficiency of optical coupling between the optical waveguide 13 and light absorption layer 14 is made gradually larger in the traveling direction of light in the optical waveguide 13. In other words, the effective light absorption coefficient of the light absorption region 17 is set to be small on the light incident side and becomes gradually larger as the light travels.

Therefore, according to this invention, reduction in the absorption efficiency of the light absorption region 17 on the incident side and the breakdown of the Schottky barrier due to concentration of current which have been problems in the prior art can be prevented. Further, since the effective refractive index in the optical waveguide 13 gradually varies in a range in which the end face of the light absorption layer 14 intersects the optical waveguide 13, reflection of incident light at the interface between the optical waveguide and the light absorption region can be suppressed. In this case, if the angle $\theta$ between the optical waveguide and the end face of the light absorption layer is set to be smaller, the effect of suppressing the light reflection can be made more effective, but if the angle is set to be too small, the length of the light absorption region becomes excessively large, thereby increasing the capacity and consequently lowering the response speed. In contrast, if the angle is set to be larger than 45°, light reflected at the interface in which the effective refractive index varies is returned to the laser directly or after being repeatedly reflected on the side surfaces of the waveguide. Therefore, $\theta$ must be set to be less than 45°, and in practice, $\theta$ is preferably set in a range from 1° to 10°.

As a result, reduction in the absorption efficiency and an increase in noise of the laser due to returned light can be previously prevented. Further, since the light absorption coefficient in the light absorption region 17 becomes larger as the light travels, it is not necessary to increase the length of the absorption region. Therefore, the area of the photoelectric element an be made small and the capacity of the element can be reduced.

Figure 2:
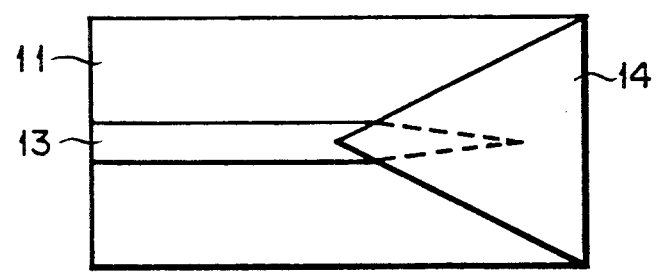
FIG. 2 is a plan view of an integrated optical semiconductor device according to another embodiment of this invention in which two sides of a light absorption layer are tapered.

The end face of the light absorption layer 14 may be so formed that two sides thereof may be made to diverge in a tapered form and intersect the optical waveguide 13 instead of intersecting only one side thereof with the optical waveguide 13 at a small angle. At this time, as shown in FIG. 2, the effect of this invention can be further enhanced by forming the optical waveguide 13 narrower in a tapered form. This is because light propagating along the optical waveguide 13 is cut off by the tapered configuration of the optical waveguide 13 so that light can be leaked out to the exterior of the optical waveguide 13 without fail. Further, since the light absorption layer 14 is formed in a reversely tapered form, the mode of light can be easily matched between the optical waveguide 13 and the light absorption layer 14. As a result, a light absorption layer having reduced light reflection and loss and high absorption efficiency.

Figure 3:
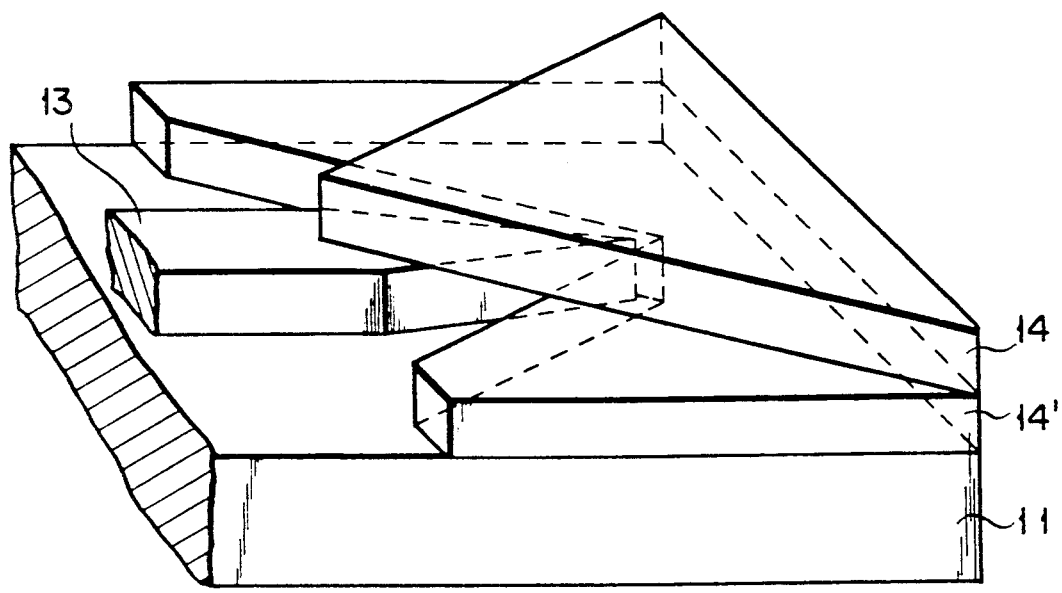
FIG. 3 is a perspective view of an integrated optical semiconductor device according to still another embodiment of this invention in which two sides of a light absorption layer are tapered.

As shown in FIG. 3, the absorption efficiency can be further enhanced by disposing a second light absorption layer 14' on both side portions of the optical waveguide 13 in addition to the first light absorption layer 14. At this time, a distance between the second light absorption layer 14' and the optical waveguide 13 is preferably set to be large on the incident side and become gradually smaller in the light traveling direction. That is, the second light absorption layer 14' is formed to have a tapered recess portion which is tapered in a tapering direction opposite to that of the front portion of the first light absorption layer 14.

Figure 4:
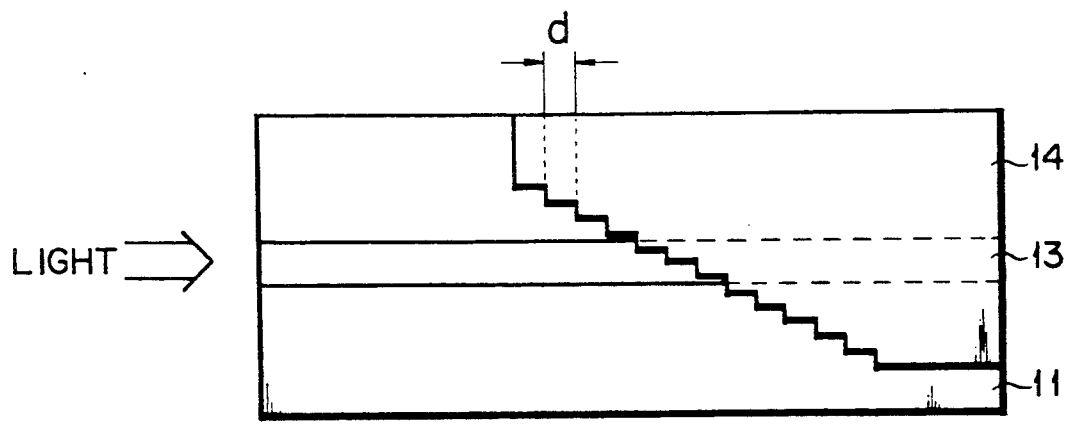
FIG. 4 is a plan view of an integrated optical semiconductor device according to another embodiment of this invention in which a light absorption layer is formed in a stepped configuration.

In the embodiment shown in FIGS. 1A to C, the end face of the light absorption layer 14 which intersects the optical waveguide 13 is formed in a linear form, but the end face is not necessarily formed in a linear form and can be formed in a stepped form as shown in FIG. 4. At this time, if the difference d in level in the direction of the waveguide satisfies the condition that $d=\lambda/4n$ where $\lambda$ denotes the wavelength of light passing through the optical waveguide 13 and n denotes the effective refractive index given by the optical waveguide 13 and the light absorption layer 14, the effect of reducing the rate of reflection at the interface between the optical waveguide and the light absorption layer can be further enhanced. For example, if $\lambda$ is set at 1.55 μm and n is set at 3.3, d is set to 0.12 μm. Since, in practice, it is difficult to attain such a fine patterning process, a value equal to an odd multiple of the above value d may be used. In this case, the same effect of reducing the rate of reflection at the interface as that obtained when d=0.12 μm can be attained.

Figure 5:
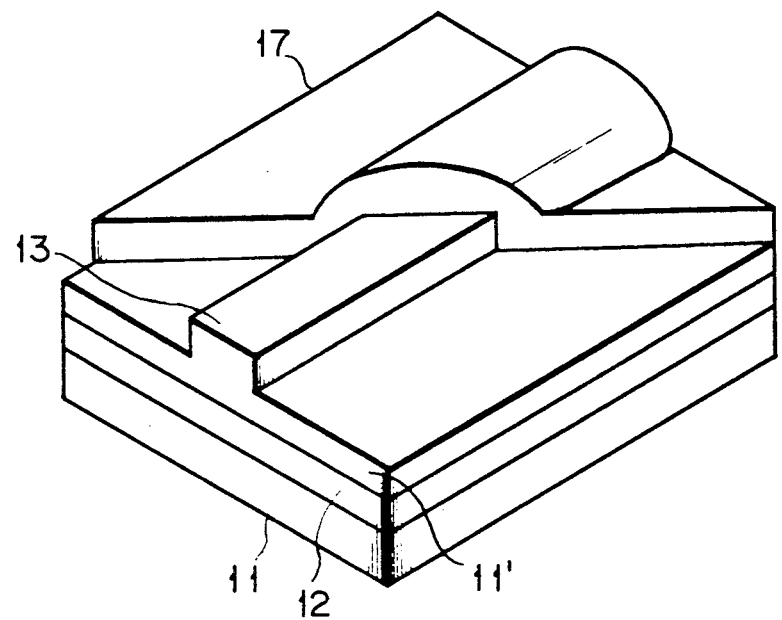
FIG. 5 is a perspective view of an integrated optical semiconductor device according to still another embodiment of this invention having an optical waveguide of ridge structure.
Figure 6:
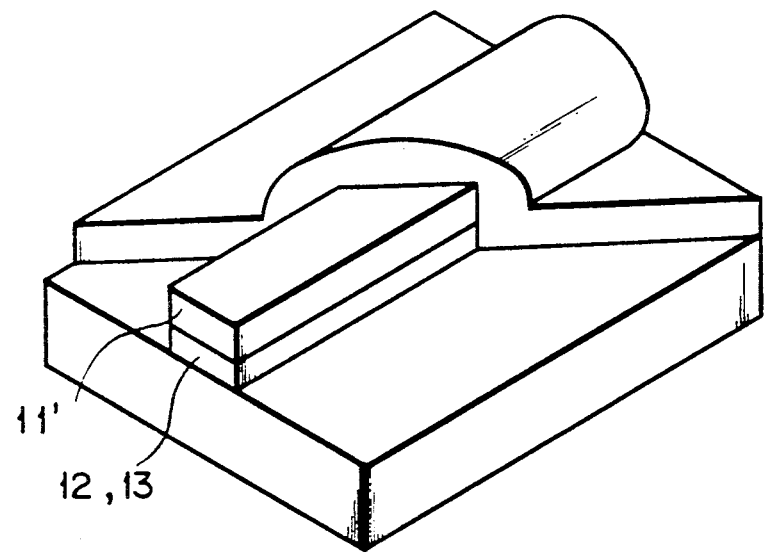
FIG. 6 is a perspective view of an integrated optical semiconductor device according to another embodiment of this invention having an optical waveguide of ridge structure.

Further, the optical waveguide 13 is not necessarily formed with the buried structure as shown in FIG. 1C, but it may be formed with a ridge structure as shown in FIGS. 5 and 6. That is, with the structure shown in FIG. 5, an optical waveguide layer having an optical waveguide 13 formed to protrude at the central portion thereof is formed on the InGaAsP layer 12 which is formed on the InP substrate 11. An InGaAs light absorption layer 14 and an InAlAs Schottky barrier layer 15 having inclined end faces which intersect the underlaid optical waveguide 13 at a small angle (for example, $\theta=1°$) are formed on the waveguide layer 13'. According to the structure shown in FIG. 6, the optical waveguide 13 is formed on the substrate 11 and an InP layer 11' is laminated on the optical waveguide 13. The light absorption layer 14 and Schottky barrier layer 15 having inclined end faces which intersect the optical waveguide 13 at a small angle (for example, $\theta=1°$) are formed on the semiconductor structure shown in FIG. 6.

Figure 7:
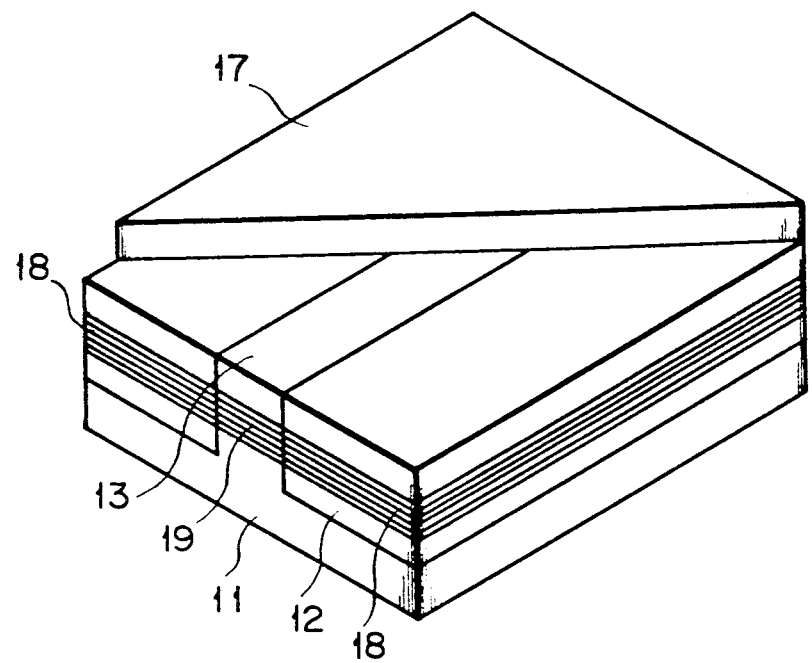
FIG. 7 is a perspective view of an integrated optical semiconductor device according to still another embodiment of this invention having an optical waveguide of multiple well structure.

Further, the optical waveguide 13 may be formed to have an MQW (multiple quantum well) structure 19 surrounded by a disordered region 18 formed by diffusing impurity such as Zn as shown in FIG. 7.

Figure 8:
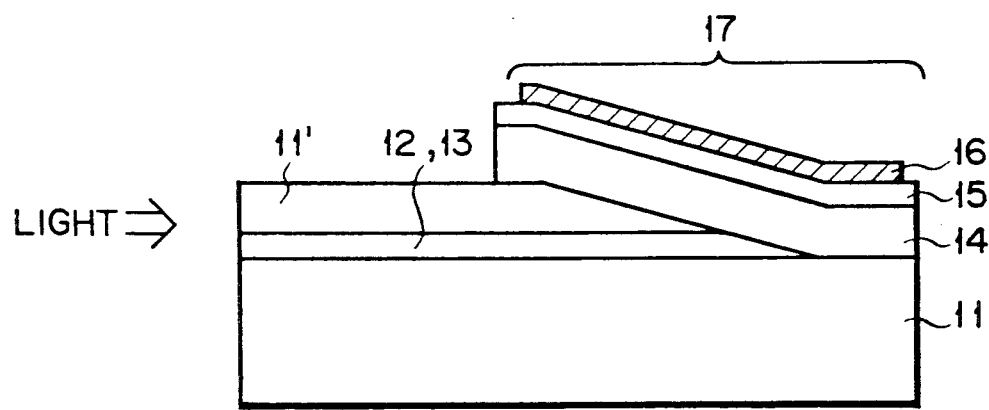
FIG. 8 is a perspective view of an integrated optical semiconductor device according to still another embodiment of this invention having an optical waveguide which is formed to become thinner in the traveling direction of light.

Further, as shown in FIG. 8, a distance in the depth direction between the bottom surface of the optical waveguide 13 and the bottom surface of the light absorption layer 14 may be changed in a light traveling direction instead of inclining the end face of the light absorbing layer 14. That is, the optical waveguide layer 13 is formed to become gradually thinner in the light traveling direction and the light absorption layer 14 is formed on the inclined optical waveguide layer 13. At this time, high absorption efficiency can be attained with a short length of the absorption region by completely intersecting the end portion of the light absorption layer 14 with the optical waveguide 13, and the response speed can be effectively enhanced.

Further, the optical waveguide 13 and light absorption layer 14 are not necessarily formed in a laminated configuration, and may be disposed in a lateral direction as shown in FIGS. 9 and 10. That is, the end face of the light absorption layer 14 is slightly inclined with respect to the linear end face of the optical waveguide 13 in FIG. 9 and the optical waveguide 13 is inclined to come closer to the linear end face of the light absorption layer 14 in FIG. 10. In these cases, a distance d between the optical waveguide 13 and the light absorption layer 14 may be linearly reduced, but the effect of this invention can be enhanced by exponentially decreasing the distance d with respect to a distance $(-x)$ from the incident surface of the light absorption region 17 towards the light transmitting surface. This is because the coupling between the wave-guide and the light absorption layer is determined by the exponent of a distance between them.

In a case where the light absorption layer 14 is depleted, it is not necessary to apply a reverse bias voltage between a pair of Schottky electrodes and the PN junction may be reversely biased. An example of the above case is shown in FIGS. 11 and 12.

Figure 11:
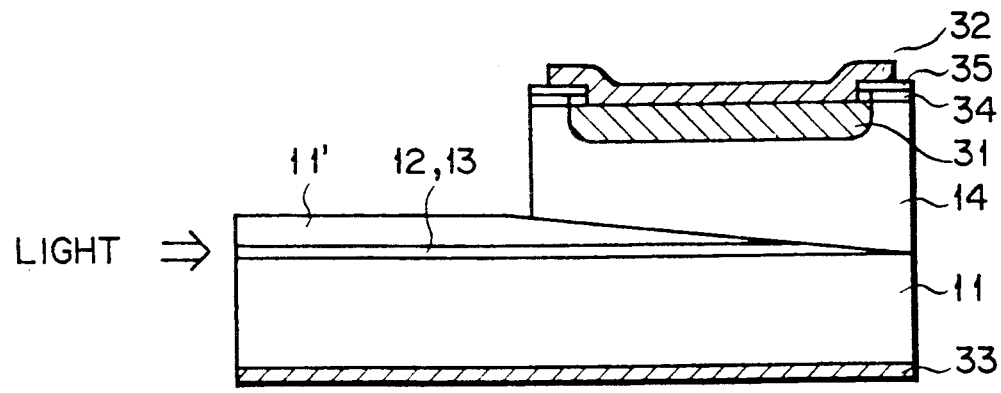
FIGS. 11 and 12 are cross sectional views of an integrated optical semiconductor device according to another embodiment of this invention and having a photodiode formed of PN junction.

As shown in FIG. 11, an optical waveguide layer 13 and an InP layer 11' laminated on the optical waveguide layer 13 are formed and inclined to become gradually thinner in the light traveling direction in the same manner as in the embodiment of FIG. 8. An n-type light absorption layer 14 is formed on the laminated inclined portion of the optical waveguide layer 13 and InP layer 11'. A p-type region 31 is formed by diffusing Zn or the like into the light absorption layer 14, a p-type side electrode 32 is formed on the p-type region 31 and an n-type side electrode 33 is formed on the substrate 11. An InP cap layer 34 and an SiN passivation film 35 are laminated on each other and disposed around the light absorption layer 14.

Figure 12:
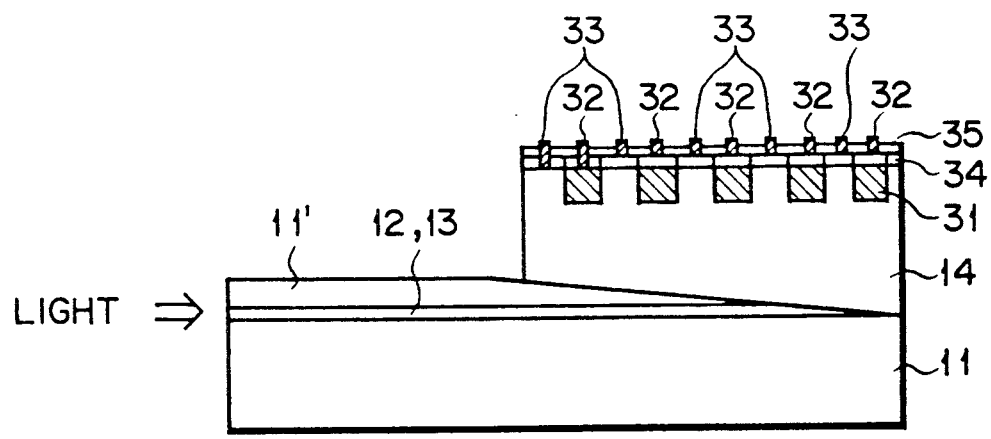

As shown in FIG. 12, a plurality of p-type regions 31 are formed by diffusing Zn or the like into the light absorption layer 14 and an InP cap layer 34 and an SiN passivation film 35 are laminated on each other and formed on the light absorption layer 14. P-type side electrodes 32 are formed on the respective portions of the InP cap layer 34 which lie on the p-type regions 31 via the SiN passivation film 35, and n-type side electrodes 33 are formed on different portions of the InP cap layer 34 which lie on the light absorption layer 14 via the SiN passivation film 35.

Figure 13:
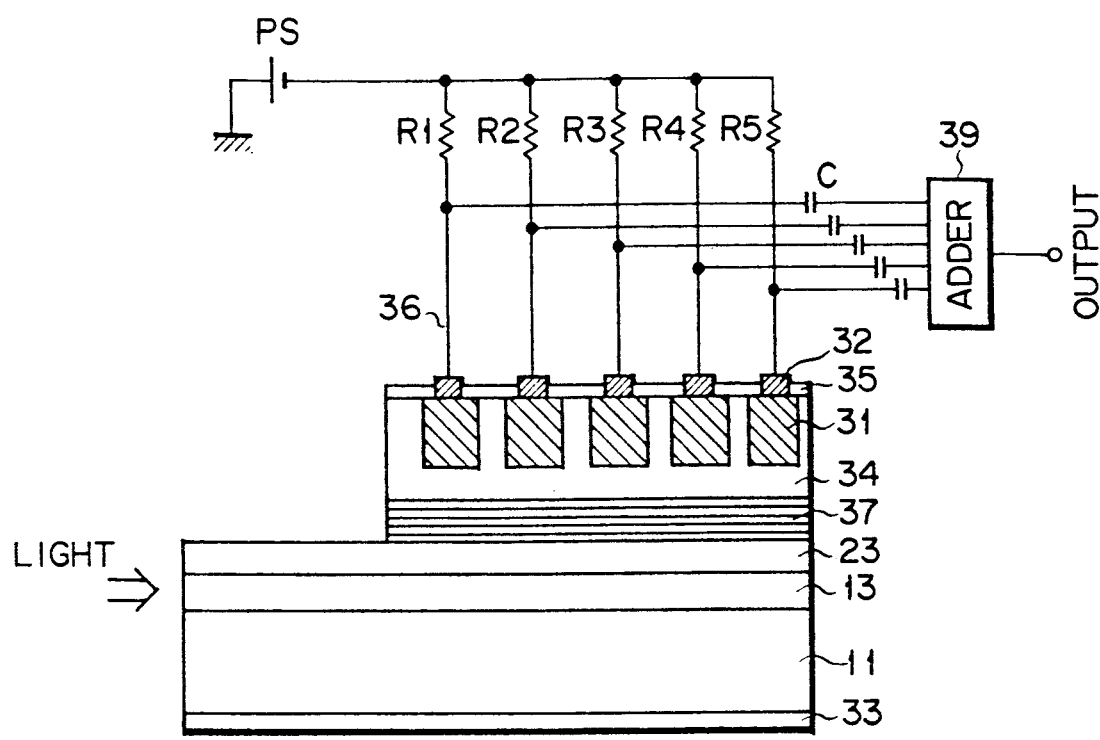
FIG. 13 is a cross sectional view of an integrated optical semiconductor device according to another embodiment of this invention and having a photodiode formed of quantum well structure.

According to an embodiment of FIG. 13, a plurality of photodiodes 36 in which a light absorption layer 37 is formed with quantum well structure are disposed in a direction of the waveguide, the photodiodes 36 have wells of the same width and thickness and the absorption coefficient of each of the photodiodes is changed by changing voltage applied to the well. That is, according to this embodiment, an optical waveguide 13 and an InP etching stop layer 23 are sequentially formed on one-side surface of the substrate 11 and an n-type side electrode 33 is formed on the other side surface of the substrate 11. The light absorption layer 37 with the quantum well structure is formed on the InP etching stop layer 23. An InP cap layer 34 is formed on the light absorption layer 37. A plurality of p-type regions 31 are formed by diffusing Zn or the like into the InP cap layer 34. An SiN passivation film 35 is formed on the InP cap layer 34 and the p-type regions 31 and electrodes 32 are respectively formed on the p-type regions 31 via the film 35. The electrodes 32 are connected to a power source PS via resistors R1, R2, R3, R4 and R5, respectively, and connected to an adder 39 via respective capacitors C.

With the structure shown in FIG. 13, the resistances of the resistors R1 to R5 connected to the respective photodiodes are set to become gradually smaller in a direction from the light incident side towards the light transmitting side in a case where the wells of the light absorption layer 37 have the same width. That is, the resistances are set such that $R1>R2>R3>R4>R5$.

Figure 14:
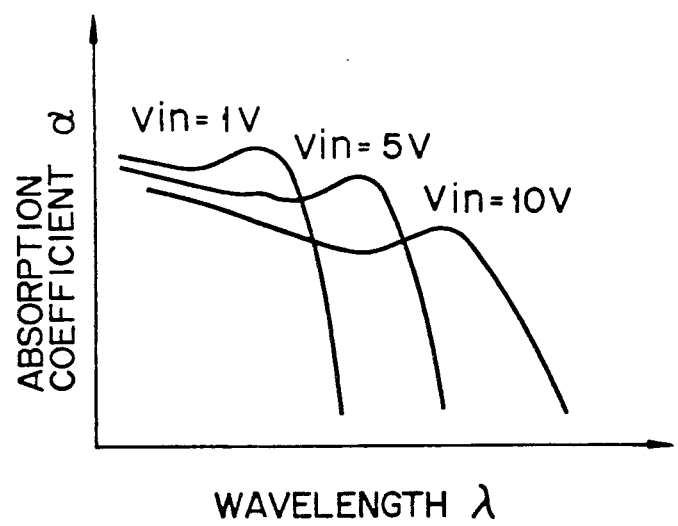
FIG. 14 is a diagram showing the relation between the wavelength and the absorption coefficient for illustrating the operation of the device shown in FIG. 13.

When the resistances are set to sequentially vary as described above, that is, when voltages applied to the MQW photodiodes are changed as shown in FIG. 14, for example, the wave lengths at the absorption ends of the photodiodes are gradually changed so that the absorption coefficient for a constant wavelength may be changed. In contrast, in a case where the width and thickness of the well are set to be gradually changed, the resistances of the resistors R1 to R5 connected to the respective photodiodes may be set to the same value. Also, in this case, since the wavelength at the absorption end of the photodiode is gradually changed, the absorption coefficient for a constant wavelength is also changed. In either case, output signals from the photodiodes are input to the adder 39 via the capacitors C and added together.

As described above, in each of the above embodiments, the absorption coefficient can be set to be small on the light incident side and become gradually larger in the light traveling direction so that the effect of preventing concentration of current and the reflection of light can be attained. The effect can also be attained by setting the thickness of the light absorption layer 14 to be small on the light incident side and become gradually larger in the light traveling direction. The shape of the light absorbing layer 14 is shown in FIG. 15. The shape can be obtained by, for example, a method of coating weak photoresist on the light absorption layer 14 and obliquely etching the light absorption layer 14 by use of withdrawal of the photoresist by wet etching, a method of gradually changing the acceleration voltage in the dry etching process, a method of obliquely applying a beam to the absorption layer 14 in the dry etching process or the like.

A method of easily forming the cross sectional shape shown in FIG. 12 with higher controllability is explained below.

FIGS. 16A to 16G are perspective views showing semiconductor structures in the steps of manufacturing an integrated optical semiconductor device according to another embodiment of this invention. Portions which are the same as those of FIGS. 1A to 1C are denoted by the same reference numerals and the explanation therefor is omitted.

Figure 16B:
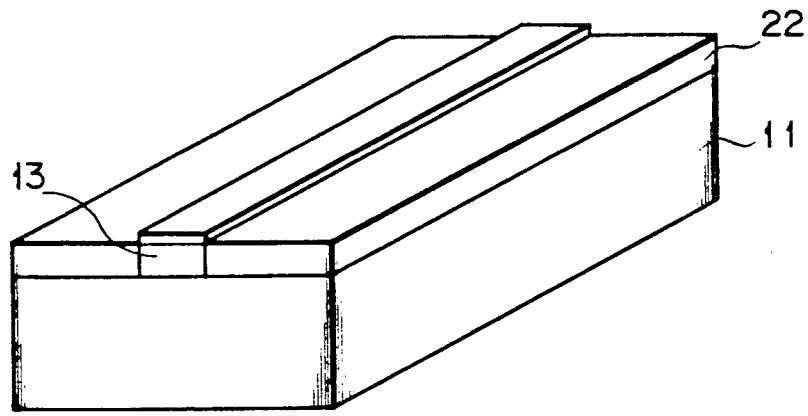

First, in the step shown in FIG. 16A, an undoped InGaAsP layer 12 having a band gap corresponding to a wavelength of 1.1 μm is formed to a thickness of 0.5 μm on an InP substrate 11 by epitaxial growth. The InGaAsP layer 12 is etched by using an SiO$_2$ mask 21 so as to form an optical waveguide 13 having a width of 3 μm on the substrate 11. After this, as shown in FIG. 16B, an undoped InP layer 22 with a thickness of 0.5 μm is formed by deposition on the substrate 11 and thus the optical waveguide 13 is buried in the InP layer 22.

Figure 16C:
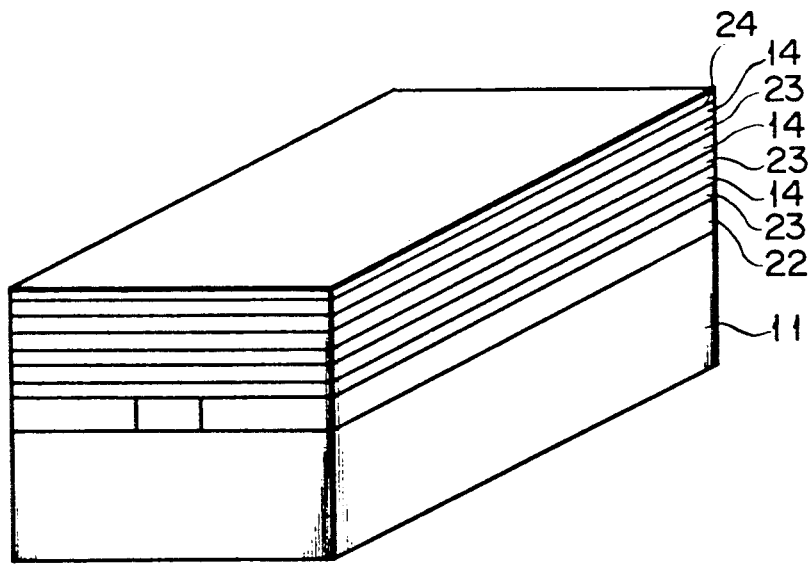

After this, as shown in FIG. 16C, undoped InP etching stop layers 23 having a thickness of 10 nm and formed of a plurality of layers, for example, three layers and undoped InGaAs light absorption layers 14 having a thickness of 20 nm are alternately laminated and finally an InP cap layer 24 is disposed on the top layer 23. After this, as shown in FIG. 16D, the top InP cap layer 24 and the InGaAs light absorption layer 14 are selectively etched out by using proper etchant, for example, alternately using HCl:H$_3$PO$_4$ and H$_2$SO$_4$:H$_2$O$_2$:H$_2$O with a photoresist used as a mask. At this time, HCl:H$_3$PO$_4$ etches InP but does not etch InGaAs, and H$_2$SO$_4$:H$_2$O$_2$:H$_2$O etches InGaAs but does not etch InP. That is, while each etchant is etching a layer, it does not etch the other layer.

Likewise, the second- and third-layered InP etching stop layer 23 and InGaAs light absorption layer 14 are selectively etched out. As a result, as shown in FIG. 16E, a shelf f of several hundred μm is formed between the layers. After this, the whole semiconductor structure is buried in the undoped InP layer 25 as shown in FIG. 16F. As shown in FIG. 16G, p-type and n-type impurities, for example, Zn, Cd or the like and Si or the like are diffused into regions lying on both sides of the optical waveguide 13 so as to form a p-type layer 26 and an n-type layer 27, and then an integrated optical semiconductor device of this embodiment is completed by forming a p-type side electrode 32 and an n-type side electrode 33.

In this embodiment, light is made incident on the optical waveguide 13 as shown by an arrow in FIG. 16G, passes through the optical waveguide 13 and incident on the photoelectric region. As described before, if the light absorption layer 14 is present on the optical waveguide 13, the refractive index at the interface thereof is sharply changed. However, in this embodiment, since the light absorption layer 13 is thin on the light incident side, variation in the effective refractive index determined by the optical waveguide 13 and the light absorption layer 14 can be suppressed. Further, since the thickness of the light absorption layer 14 is gradually changed, the effective refractive index is also gradually changed so that reflection of light can be prevented and an increase in noise of the laser due to returned light and reduction in the absorption efficiency can be prevented. Further, since it is not necessary to increase the length of the light absorption region, the area of the photoelectric region can be made small and the capacity of the element can be reduced.

Further, the light absorption rate is small on the incident side and becomes gradually larger in the light traveling direction. Therefore, concentrated generation of electron-hole pairs on the incident side of the light absorption region which has been the problem in the prior art can be suppressed so that deterioration in the response speed due to the space charge effect and the breakdown of the PN junction due to concentration of current can be prevented.

Figure 17:
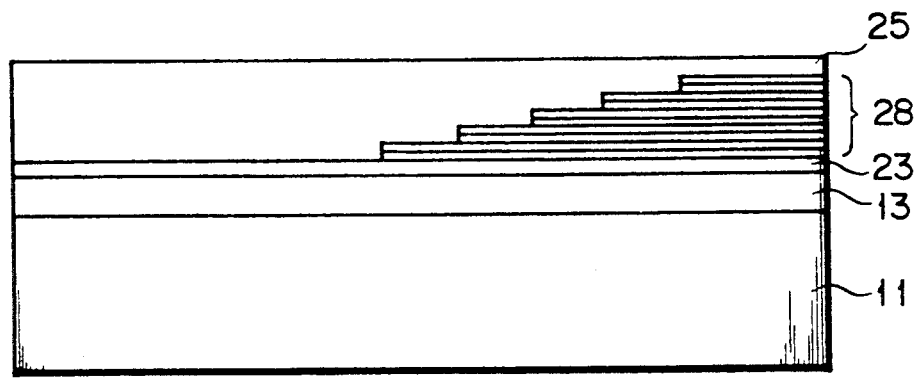
FIGS. 17 is a cross sectional view of an integrated optical semiconductor device according to still another embodiment of this invention and having an MQW light absorption layer.

The optical waveguide and the light absorption layer are not necessarily a single layer such as an InGaAs (P) layer, but may be an MQW having InP and InGaAsP layers laminated on each other, for example. An integrated optical semiconductor device having an MQW light absorption layer 28 is shown in FIG. 17. When the layers constituting the MQW have significantly different etching rates, it is not necessary to use the etching stop layer 23 shown in FIG. 16C.

In addition, as a method of setting the rate of light absorbed into the light absorption layer 14 small on the incident side of the light absorption region 17 and setting it gradually larger, a method of gradually changing the band gap of the light absorption layer 14 may be used. For example, with the same construction as shown in FIG. 16G, the value $(1-Y)$ may be gradually changed from 0 on the light incident side to 1 when the composition of the light absorption layer 14 is In$_X$Ga$_{1-X}$As$_Y$P$_{1-Y}$. As described before, like the case wherein the electric field of the MQW is changed, when the value Y for In$_X$Ga$_{1-X}$As$_Y$P$_{1-Y}$ is changed, the end of the absorption wavelength is shifted from the short wavelength region to the long wavelength region and therefore the absorption coefficient can be made gradually larger.

Figure 18:
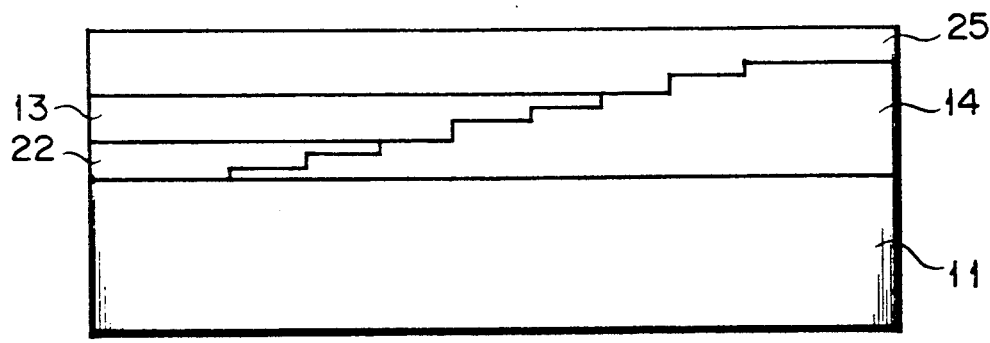
FIGS. 18 is a cross sectional view of an integrated optical semiconductor device of butt joint coupling type according to another embodiment of this invention.

This invention is not limited to the above embodiments. For example, the wavelength of light propagating in the optical waveguide is not limited to 1.55 μm, the composition of the semiconductor is not limited to InP, InGaAsP, and this invention can be applied to another wavelength and the semiconductor of another composition. Further, the coupling between the optical waveguide and the photoelectric element is not necessarily the evanescent coupling shown in FIG. 17 and may be the butt joint coupling as shown in FIG. 18. In addition, another electronic element and optical semiconductor device can be easily integrated by use of this invention. Further, this invention can be variously modified without departing from the technical scope thereof.

As described above, according to this invention, since concentrated generation of electron-hole pairs on the incident side of the light absorption region can be suppressed, deterioration in the response speed due to the space charge effect and the breakage of the device due to concentration of current can be prevented. Further, since the reflection of incident light at the interface between the optical waveguide and the light absorption region can be suppressed, an increase in noise of the laser by the returned light and deterioration in the absorption efficiency can be prevented.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An integrated optical semiconductor device comprising:
   a semiconductor optical waveguide having a light incident end on which light in incident, for guiding the incident light in a preset direction; and
   a light absorption semiconductor layer integrated together with said semiconductor optical waveguide, for absorbing light traveling in said preset direction in said optical waveguide;
   wherein said light absorption semiconductor layer has an effective absorption coefficient which is set to be small on said light incident end side and become gradually larger in said preset direction.

2. An integrated optical semiconductor device according to claim 1, wherein said light absorption semiconductor layer is formed on said optical waveguide to have an end face which is set to make a preset angle with respect to said preset direction in said optical waveguide.

3. An integrated optical semiconductor device according to claim 2, wherein said end face of said light absorption semiconductor layer is set to make an angle of less than 45° with respect to the preset direction.

4. An integrated optical semiconductor device according to claim 2, wherein said end face of said light absorption semiconductor layer is set to make an angle of 1° to 10° with respect to the preset direction.

5. An integrated optical semiconductor device according to claim 1, wherein said light absorption semiconductor layer is formed on said semiconductor optical waveguide to have a tapered front end portion which becomes wider in the preset direction in said semiconductor optical waveguide, said front end portion having two sides which intersect said semiconductor optical waveguide.

6. An integrated optical semiconductor device according to claim 5, wherein said semiconductor optical waveguide is formed to have a front end portion which is tapered in a direction opposite to the tapered direction of said front end portion of said light absorption semiconductor layer.

7. An integrated optical semiconductor device according to claim 6, further comprising a second light absorption semiconductor layer disposed near said front end portion of said optical waveguide, said second light absorption semiconductor layer being formed in such a shape that a distance between said second light absorption semiconductor layer and said front end portion of said semiconductor optical waveguide can be set to be large on the light incident side and become gradually smaller in the preset direction.

8. An integrated optical semiconductor device according to claim 2, wherein said end face of said light absorption semiconductor layer is formed in a stepped configuration.

9. An integrated optical semiconductor device according to claim 8, wherein said stepped end face has a difference in level equal to $\lambda/4n$ wherein the wavelength of light traveling in said optical waveguide is $\lambda$ and the effective refractive index determined by said optical waveguide and light absorption semiconductor layer is n.

10. An integrated optical semiconductor device according to claim 1, wherein said semiconductor optical waveguide is formed of a semiconductor optical waveguide having a buried type structure.

11. An integrated optical semiconductor device according to claim 1, wherein said semiconductor optical waveguide is formed of a semiconductor optical waveguide having a ridge structure.

12. An integrated optical semiconductor device according to claim 1, wherein said semiconductor optical waveguide is formed of a semiconductor optical waveguide having a multiple quantum well structure surrounded by an impurity region.

13. An integrated optical semiconductor device according to claim 1, wherein said semiconductor optical waveguide is formed to become gradually thinner in the preset direction.

14. An integrated optical semiconductor device according to claim 1, wherein said semiconductor optical waveguide and light absorption semiconductor layer are arranged in a lateral direction and said light absorption semiconductor layer has an end face which is slightly inclined with respect to said semiconductor optical waveguide.

15. An integrated optical semiconductor device according to claim 1, wherein said semiconductor optical waveguide layer and light absorption semiconductor layer are arranged in a lateral direction and said semiconductor optical waveguide is formed to become gradually closer to said light absorption semiconductor layer in the preset direction.

16. An integrated optical semiconductor device according to claim 1, wherein said semiconductor optical waveguide has an inclined portion which is formed to become gradually thinner in the preset direction and said light absorption semiconductor layer is formed on said inclined portion.

17. An integrated optical semiconductor device according to claim 1, further comprising a plurality of p-type regions selectively formed by diffusion in said light absorption semiconductor layer;
   a plurality of p-type side electrodes respectively formed on said p-type regions; and a plurality of n-type side electrodes selectively formed on said light absorption semiconductor layer.

18. An integrated optical semiconductor device according to claim 1, wherein said light absorption semiconductor layer is formed of a light absorption semiconductor layer having a quantum well structure and which further comprises:
- a cap layer formed on said light absorption semiconductor layer;
- a plurality of p-type regions formed in said cap layers;
- a plurality of electrodes respectively formed on said p-type regions; and
- a plurality of resistors respectively connected to said electrodes; and
- means for applying bias voltage to said p-type regions via said plurality of resistors.

19. An integrated optical semiconductor device according to claim 1, wherein the light absorption semiconductor layer is formed of a light absorption semiconductor layer whose thickness increases in a stepwise manner in the preset direction.

20. An integrated optical semiconductor device comprising:
- a semiconductor substrate;
- a semiconductor optical waveguide formed on said semiconductor substrate and having a light incident end on which light is made incident, for guiding the incident light in a preset direction; and
- a light absorption semiconductor layer integrated together with said semiconductor optical waveguide on said semiconductor substrate, for absorbing light traveling in said preset direction in said semiconductor optical waveguide, said light absorption semiconductor layer having an effective absorption coefficient which is set to be small on said light incident end side and become gradually larger in said preset direction.

* * * * *